United States Patent
Sokolov et al.

(10) Patent No.: US 10,831,107 B2
(45) Date of Patent: Nov. 10, 2020

(54) METHOD FOR OF MEASURING A PARAMETER RELATING TO A STRUCTURE FORMED USING A LITHOGRAPHIC PROCESS

(71) Applicant: ASML Netherlands B.V., Veldhoven (NL)

(72) Inventors: Sergei Sokolov, Utrecht (NL); Jin Lian, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/556,685

(22) Filed: Aug. 30, 2019

(65) Prior Publication Data
US 2020/0089125 A1    Mar. 19, 2020

(30) Foreign Application Priority Data
Sep. 14, 2018   (EP) .................................... 18194625

(51) Int. Cl.
*G03F 7/20* (2006.01)

(52) U.S. Cl.
CPC ...... *G03F 7/70625* (2013.01); *G03F 7/70641* (2013.01)

(58) Field of Classification Search
CPC ............. G03F 7/70625; G03F 7/70641; G03F 7/70633
See application file for complete search history.

(56) References Cited

U.S. PATENT DOCUMENTS

| | | | |
|---|---|---|---|
| 5,124,927 A | 6/1992 | Hopewell et al. | |
| 6,183,919 B1 | 2/2001 | Ausschnitt et al. | |
| 8,045,179 B1 * | 10/2011 | Zhuang ................ | G01B 11/303 356/600 |
| 2004/0218192 A1 * | 11/2004 | Bischoff .............. | G01B 11/303 356/600 |
| 2006/0033921 A1 | 2/2006 | Den Boef et al. | |
| 2006/0066855 A1 | 3/2006 | Boef et al. | |

(Continued)

FOREIGN PATENT DOCUMENTS

| | | |
|---|---|---|
| WO | WO 2009078708 A1 | 6/2009 |
| WO | WO 2009106279 A1 | 9/2009 |
| WO | WO 2013178422 A1 | 12/2013 |

OTHER PUBLICATIONS

Bodermann, et al., "Optical dimensional metrology at Physikalisch-Technische Bundesanstalt (PTB) on deep sub-wavelength nanostructured surfaces," Surface Topography: Metrology and Properties, vol. 4, No. 2, 024014 (May 18, 2016); 13 pages.

*Primary Examiner* — Steven Whitesell Gordon
(74) *Attorney, Agent, or Firm* — Sterne, Kessler, Goldstein & Fox P.L.L.C.

(57) ABSTRACT

Disclosed method of measuring a parameter relating to a structure formed using a lithographic process, and more specifically focus or line edge roughness. The method includes measuring a structure having a dimension, e.g., a critical dimension, which is sufficiently large to enable radiation diffracted by at least one edge of said structure to be (e.g., individually) optically resolved. The method comprises obtaining an intensity metric from an image of the at least one edge and determining a value for said parameter based on the intensity metric.

20 Claims, 5 Drawing Sheets

(56) References Cited

U.S. PATENT DOCUMENTS

| | | |
|---|---|---|
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0052418 A1* | 3/2012 | Tian .................. G03F 1/70 430/5 |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2016/0026096 A1* | 1/2016 | Verma ............ G01N 21/4738 355/67 |

* cited by examiner

METHOD FOR OF MEASURING A PARAMETER RELATING TO A STRUCTURE FORMED USING A LITHOGRAPHIC PROCESS

FIELD OF THE INVENTION

The present invention relates to methods and apparatus for measuring applied patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process.

One important parameter which should be monitored is focus of the projection optics on the substrate when performing an exposure. For a number of reasons, this focus can drift over time and over the substrate (e.g., because the substrate is not perfectly flat). Focus monitoring typically comprises measuring structures having assist features or sub-resolution features (smaller than the imaging resolution of the projection optics). These sub-resolution features, while not imaged, affect the main structure by imposing an asymmetry which is dependent on focus. Therefore, measuring of this asymmetry (e.g., using a scatterometer) means that the focus can be inferred. However, such methods are difficult to implement for EUV lithography, due to the thin resists used.

Another important parameter is line edge roughness (LER), which is a measure of the deviation of a feature edge (as viewed top-down) from a smooth, ideal shape, that is, the edge deviations of a feature that occur on a dimensional scale smaller than the resolution limit of the imaging tool that was used to print the feature. LER may typically be expressed as a standard deviation of the edge position. Scanning electron microscopy (SEM) is typically used to measure LER; however this is a slow process and therefore not suited for high volume manufacturing.

It is desirable to address at least some of the issues raised above.

SUMMARY OF THE INVENTION

In a first aspect of the invention, there is provided a method of measuring a parameter relating to a structure formed using a lithographic process, wherein said structure has a dimension which is sufficiently large to enable radiation diffracted by at least one edge of said structure to be optically resolved, the method comprising: obtaining an intensity metric from an image of the at least one edge; and determining a value for said parameter based on the intensity metric.

In a second aspect of the invention, there is provided a processing device for determining a correction for control of at least one manufacturing apparatus configured to provide product structures to a substrate in a manufacturing process, the processing device being configured to perform the method of the first aspect.

In a third aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
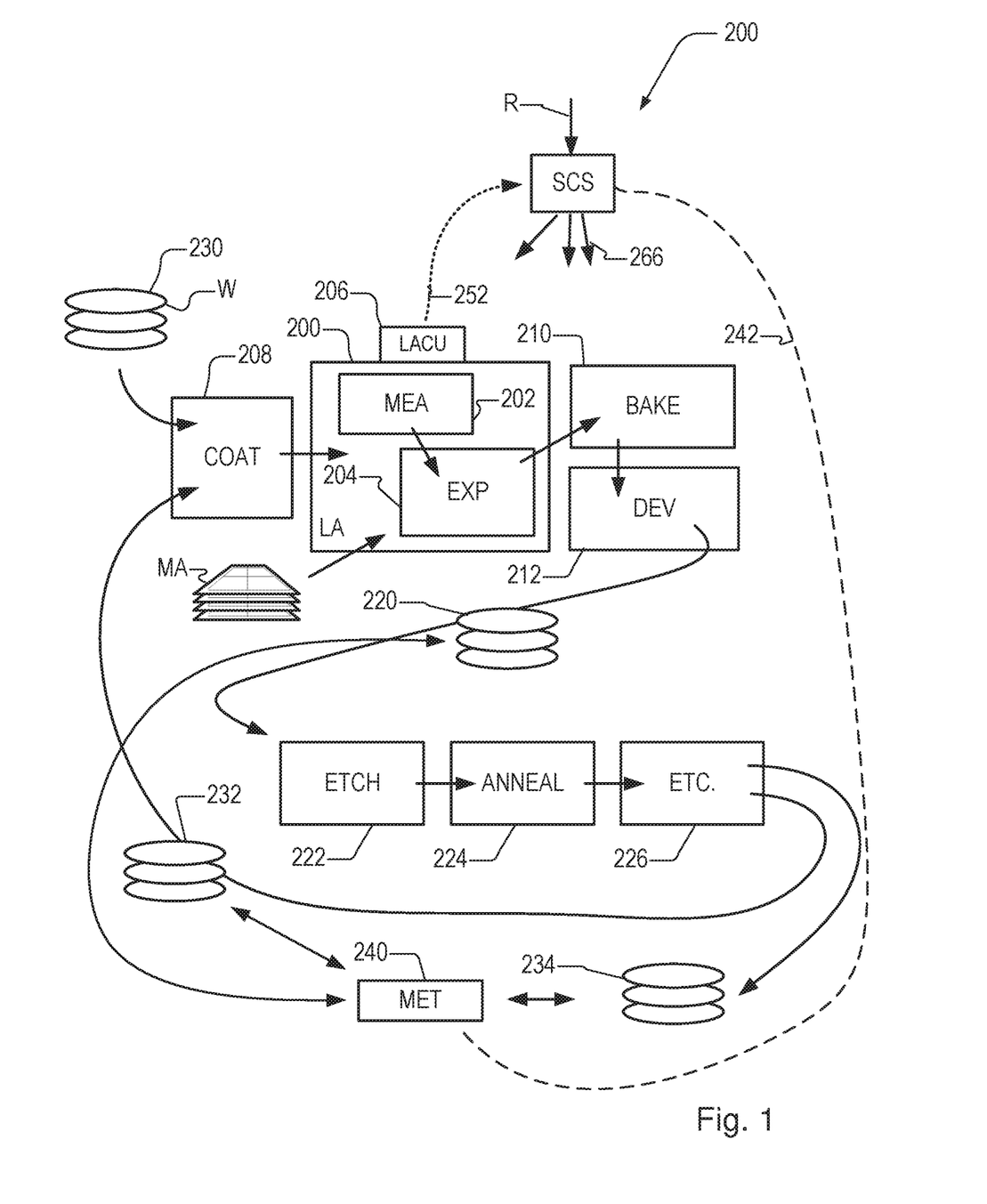
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figures 2A, 2B:
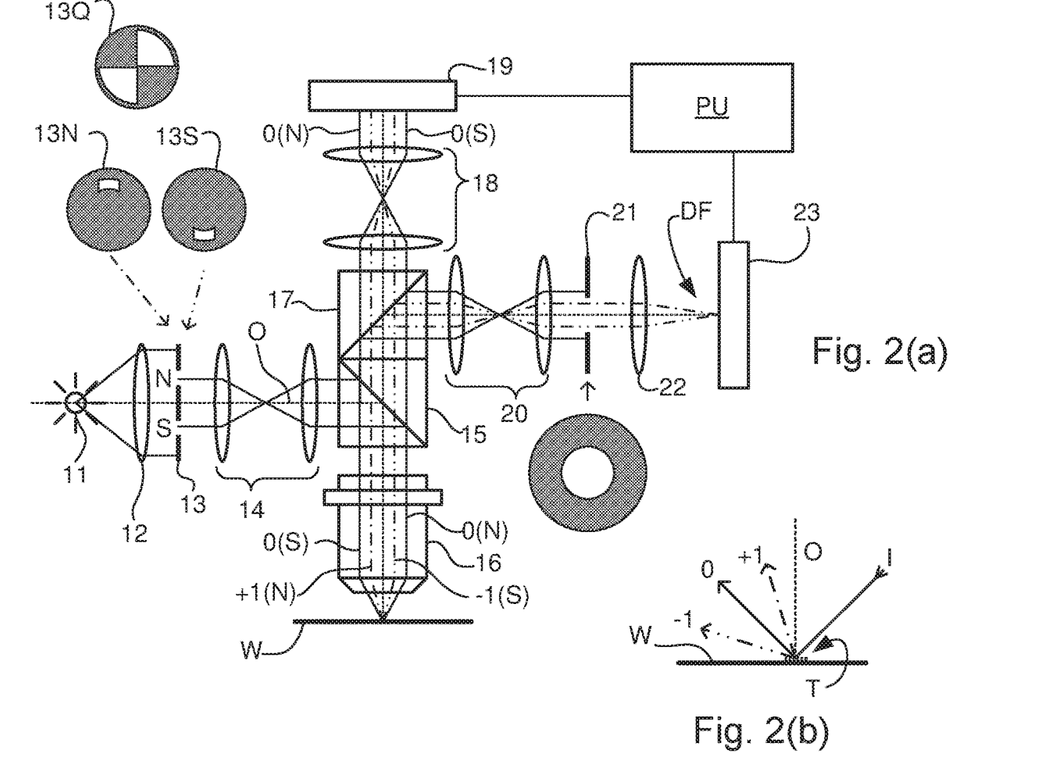
FIGS. 2(a)-2(b) comprise a schematic diagram of a scatterometer for use in measuring targets according to embodiments of the invention.

A metrology apparatus suitable for use in embodiments of the invention is shown in FIG. 2(a). This is purely an example of metrology apparatus and any suitable metrology apparatus may be used (e.g., for performing dark-field measurements). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. An illumination mode described in some of the embodiments below is the quad illumination mode 13Q, also illustrated, which separates higher diffraction orders (e.g., +1 and −1) into diagonally opposed quadrants of the image, with the zeroth order directed to the other two quadrants. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. Alternatively, wedges may be provided wedge to create split images from the −1 and +1 first order beams simultaneously (e.g., to obtain an image such as indicated in FIG. 6(b) below). The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process.

Figure 3:
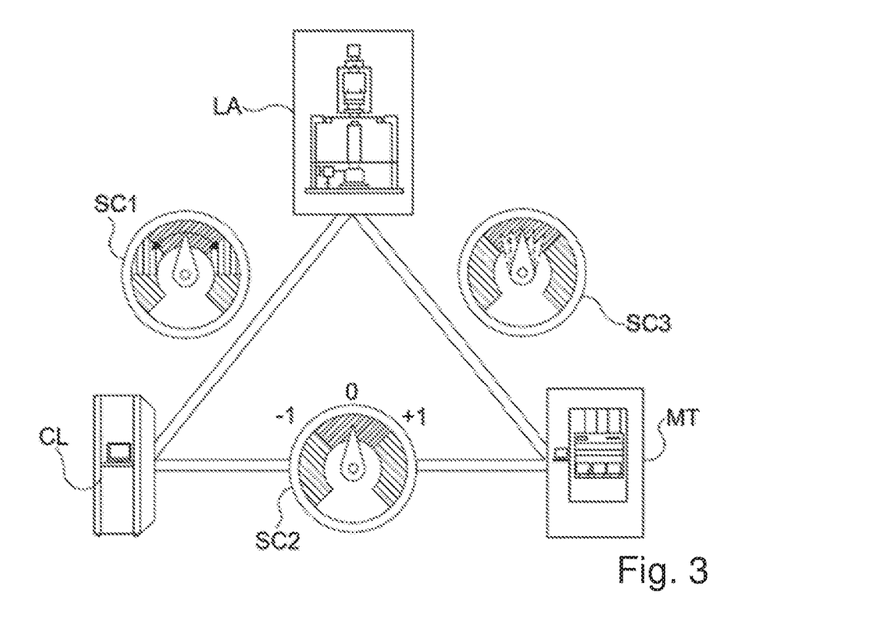
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Focus monitoring is an important parameter for proper lithographic apparatus performance. In non-EUV systems, one method for monitoring focus is diffraction based focus (DBF). This comprises exposing structures with a deliberate focus dependent asymmetry. By measuring this asymmetry on the exposed structure, the focus at exposure can be inferred. However limitations, such as thin resist thicknesses, mean that DBF is not always suitable (or is at least more difficult to implement) for EUV systems. Astigmatism based focus (ABF) is an alternative method to DBF which provides a solution for EUV focus monitoring. However, such a method requires astigmatism to be induced in the imaging lens, which means it cannot be used for on-product metrology. To address these issues, an optical focus metrology technique will be described, which does not require focus dependent side-wall angle (SWA) asymmetry (only SWA variation through focus), and which is suitable for on-product application. Also described is an extension of the basic technique for measurement of line edge roughness (LER).

Figure 4A:
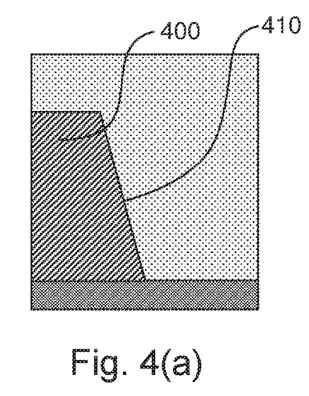
FIGS. 4(a)-4(c) depict the effect of focus on an edge profile, showing an edge profile formed 4(a) with a positive defocus, 4(b) at best focus and 4(c) with a negative defocus.
Figure 4B:
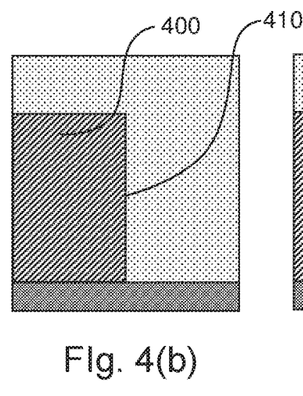
Figure 4C:
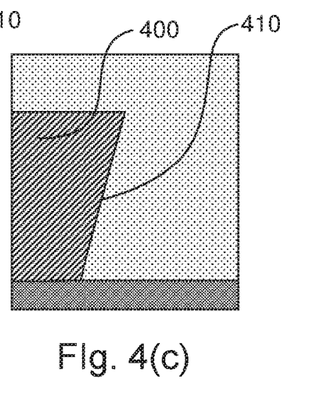
Figure 5A:
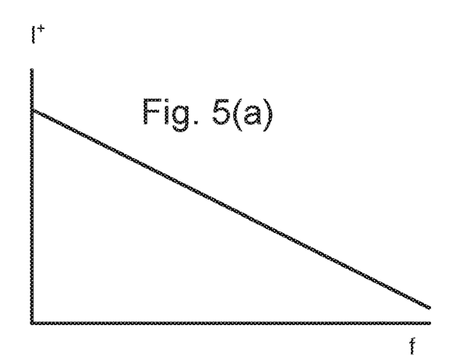
FIGS. 5(a)-5(d) are all plots of an intensity metric against focus obtained by measurement of a structure.
Figure 5B:
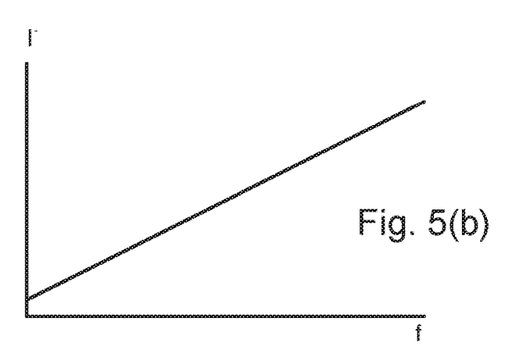
Figure 5C:
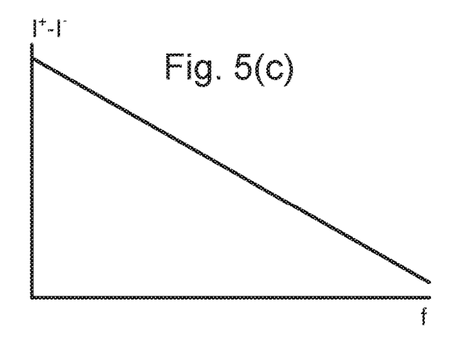
Figure 5D:
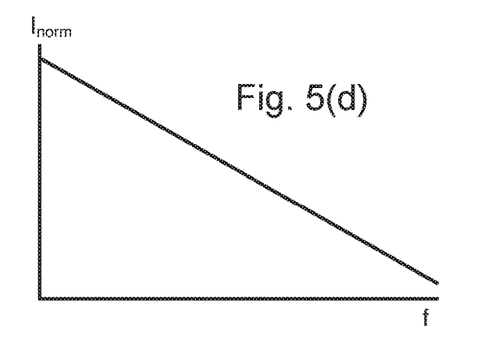

In general, the side wall angle of a printed line will vary though focus. This is illustrated in FIG. 4, which shows a cross section of part of a structure 400 showing one wall or edge 410 at (a) a positive defocus, (b) best focus and (c) a negative defocus. It can be demonstrated that this change in side wall angle for a single edge 410 varies monotonically through focus. When illuminated by measurement illumination, there will be diffraction from the edge 410 which changes with the side wall angle. When the edge is illuminated with a quad illumination mode (such as that labelled 13Q in FIG. 2(a)), the zeroth order signal will form the normal zeroth order image of the sample in the two zeroth order quadrants, while the diffracted light forms images of only the edge into the two other quadrants. It should be noted that the simultaneous imaging of the four quadrants is only possible on some apparatuses (e.g., those with optical wedges or similar optics to split the images); on other apparatuses, an aperture switch or wafer rotation may be required to separately obtain the images in the non-zero order quadrants (i.e., in separate acquisitions using single off-axis beams). However, in each case the basic principle is the same; as such any quadrant aperture, or other apertures which comprise a single off-axis illumination mode, may be used and images obtained either simultaneously or separately for each illumination direction. In fact, as described below, only a single image from illumination in only one direction is sufficient, in an embodiment.

It can be demonstrated that there is an internal asymmetry between the two diffraction quadrants, even when the wall is vertical, and that this asymmetry varies monotonically with focus. Moreover the total signal (e.g., intensity) in each quadrant also scales monotonically with focus.

FIG. 5 illustrates the monotonic dependence of an intensity metric versus focus f for a single edge. In FIGS. 5(a) and 5(b), the intensity metric is intensity of a single quadrant, i.e., a first intensity value of the edge (I') from a first quadrant (relating to illumination from a first direction) and a second intensity value of the edge (I) from a second quadrant (relating to illumination from a second direction), respectively. As such, these first and second intensity values relate to diffraction tails corresponding to illumination of the same edge from different directions (e.g., opposite angles of incidence). In FIG. 5(c), the intensity metric is the difference $I^+ - I^-$ of these edge intensities. The intensity metric in FIG. 5(d) is a normalized version of the difference of FIG. 5(c). For example, the normalized intensity metric $I_{norm}$ may be normalized by half the sum of the intensities: i.e., $$I_{norm} = 0.5(I^+ - I^-)/(I^+ + I^-).$$

Normalization may reduce any process dependency. A monotonic relationship for focus can be observed for all the intensity metric examples illustrated.

In a main embodiment, it is proposed that dark-field metrology is used to measure the edge. This enables measurement of a large periodic structure or target with multiple edges, such that each edge can be separately resolved. Each structure of the target therefore should have a dimension (e.g., width or CD) which is sufficiently large to enable radiation diffracted by its edges to be individually resolved. Using intensities of multiple edges for the intensity metric effectively amplifies the measurement signal and averages process effects. A good example of a suitable target would be a line-space grating with a large pitch. The actual minimum pitch which enables separate resolution of the opposing edges of each line depends on the optical system (e.g., the NA) and illumination wavelength. However, in general, this minimum pitch may be, purely for example, 1 μm, 2 μm, 3 μm or 5 μm. As such, the minimum CD of each individual structure (i.e., each grating feature or line) may also have these values.

More generally, the CD of each individual structure may be greater than the optical resolution of the optical system, e.g., two times greater or four times greater than the optical resolution of the optical system. A consequence of such a relatively large CD is that the edges of the structure can be optically (e.g., and individually) resolved. Here the resolution of the optical system depends on many parameters, such as the NA of illumination system, the illumination aperture, the illumination spectrum and aberrations in the system.

Figure 6A:
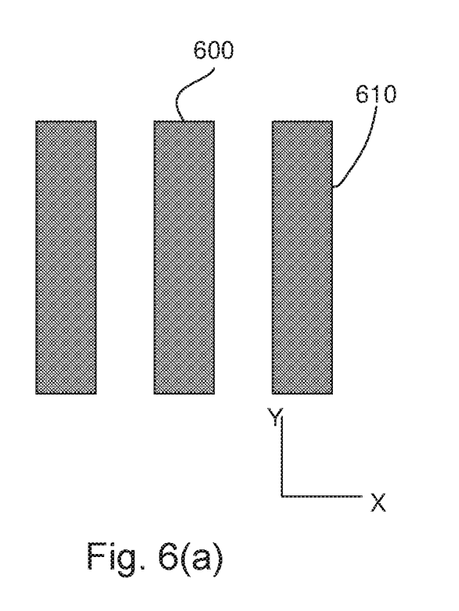
FIGS. 6(a)-6(b) is a schematic representation of 6(a) a target suitable for the measurement of focus according to embodiments of the invention; and 6(b) a resultant diffraction image following illumination using a quad aperture.
Figure 6B:
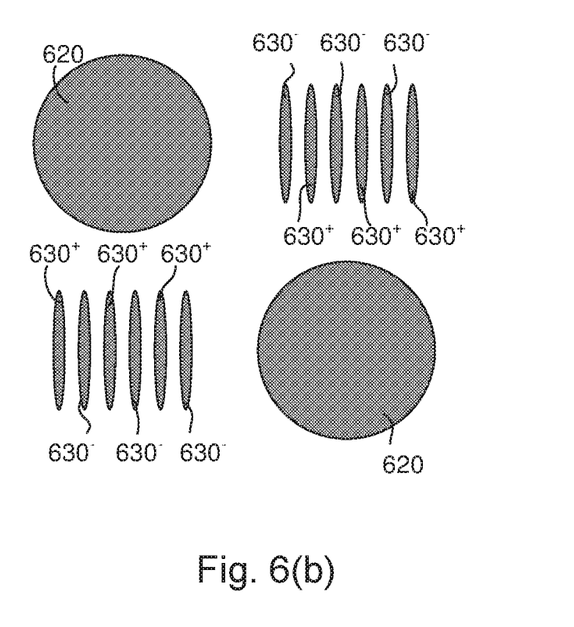

FIG. 6 shows (a) an example of such a large target, comprising three lines 600 (and therefore six edges 610), and (b) a resultant dark-field image obtained using a quad aperture, showing the zeroth order scattering 620 in two quadrants and the six diffraction edges $630^+$, $630^-$ in the other two quadrants, where the superscript differentiates the first and second diffraction edges respectively, i.e., relating to illumination from different directions. Note that right edges and left edges of like illumination directions go to opposing quadrants. This provides for a stronger signal, with respect to the single diffraction edge examples. There are a number of different intensity metrics which can be extracted from the image, from which focus can be inferred. An intensity metric may simply sum the intensities of like diffraction orders (e.g., sum all (or some) of the intensities of first diffraction edges $630^+$ and/or sum all (or some) of the intensities of second diffraction edges $630^-$). In another example, the intensity metric may comprise the difference of the summed intensities of first diffraction edges $630^+$ and the summed intensities of the second diffraction edges $630^-$. Optionally, this difference can be normalized using the sum of the (first and/or second) diffraction edge intensities for the normalization.

While the concepts described above relate to dark-field metrology, the basic concept can be extended to metrology using the pupil branch (angularly resolved scatterometry). However, this limits to measurement of only a single edge, as diffraction from more than one edge would become mixed in the pupil image, such that the edges could not be individually resolved.

It should be appreciated that other, more complex, target shapes than those described and illustrated are also possible, as only the information from their edges has to be extracted. As such, existing structures (product structures or structures formed for other purposes) could be measured using the methods described herein, instead of (or complementary with) dedicated targets. In another embodiment, the structure (e.g., line feature or features) may comprise a chopped or segmented line (e.g., resembling a dotted line with periodic breaks at points along the Y direction). Such chopped or segmented lines may be simpler to print compared to unbroken lines.

As is normal for focus measurements, a calibration should be performed to calibrate the intensity metric to the focus values. This can be done in much the same way as presently done for DBF metrology. This may comprise exposing a calibration substrate such that each field has a different (known) focus offset. The calibration substrate can be measured to determine a focus calibration plot of intensity metric versus the known focus offsets. The focus calibration plot can then be used to infer focus from subsequent intensity metric measurements (e.g., on product substrates).

While the concept described above is described in terms of measurement of focus, the principles may be extended to measurement of dose. The effect of dose on such a line may be more difficult to measure; however sensitivity to dose may be increased by using chopped lines as described above.

There are a number of advantages of this focus metrology method over DBF and ABF based techniques. The method dos not require a special target with assist features to create an SWA asymmetry. This reduces reticle cost (the features are simpler) and is more likely to be compatible with any imposed design rules. The method is appropriate for on-product EUV lithography with thinner resists.

Figure 7:
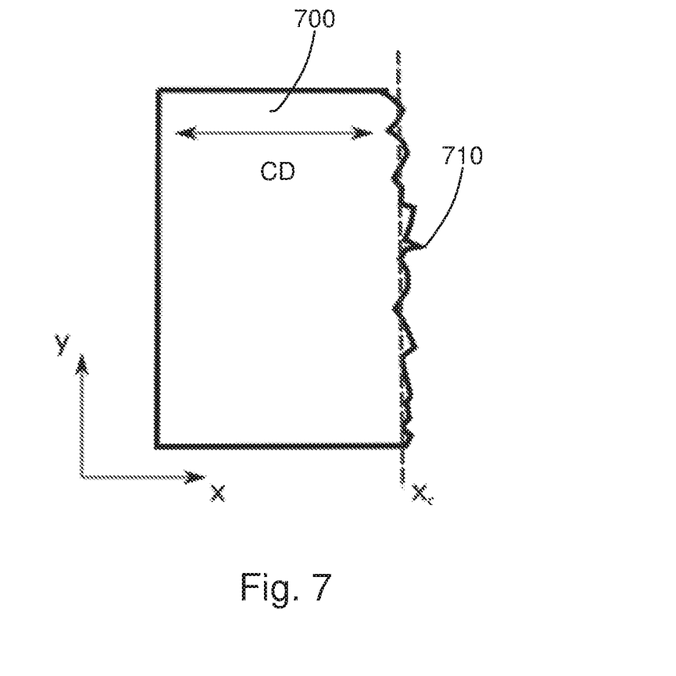
FIG. 7 is a schematic illustration of a structure having line edge roughness on one edge.

It is proposed that the basic principle described above in relation to focus metrology, be extended for measurement of line edge roughness (LER). LER is difficult parameter to measure. The current method uses an SEM (scanning electron microscope), which is slow; and as such a fast and reliable LER inspection method is desired. LER depends on many parameters and is affected by each step in the fabrication including, for example, the effects of: reticle defects, scanner source power fluctuations and shot noise; and resist development and etching. FIG. 7 illustrates LER, showing a structure 700 having a rough edge 710, with respect to an ideal edge illustrated by dotted line $X_C$.

It is proposed to measure LER from imaged diffraction edges of large structures formed on a substrate, for example lines such as already described having a minimum CD of: 1 µm, 2 µm, 3 µm or 5 µm (or CD greater than 1×, 2× or 4× the optical resolution of the system). Existing structures can be used (if such structures are present) or such structures can be printed in the scribe lane, for example. It is envisaged, going forward, that devices comprising optical circuits may comprise structures having a suitably large CD due to the fact that dimensions of optical waveguides are much larger than dimensions of transistors. Although such large structures have a CD which differs greatly from product CD, the LER of such structures should still be representative of the LER of product structures, as it is expected that LER does not depend on CD and pitch of the printed structures.

In an embodiment, the edge (or edges) of such a structure are imaged, for example using dark-field metrology with a quad aperture (or one or more other off-axis illumination modes) as already described, from which the LER will be inferred. A number of different methods for inferring LER will be described.

A first approach is based on the fact that the line edge position varies along the length of the structure in relation to the ideal position due to LER, and that this variation results in a corresponding variation of the position of peak intensity in the imaged diffraction edge. Length in this context describes the longest dimension of the feature (e.g., along the Y-axis), perpendicular to the CD. It is proposed to track the position of the line edge (X-axis) along the Y-axis, which can be used as a measure of the LER. This is essentially a peak tracking problem, and can be done with a precision of about 1 nm. An advantage of this first approach is that a measure of LER is directly obtained without the need of a calibration.

Figure 8:
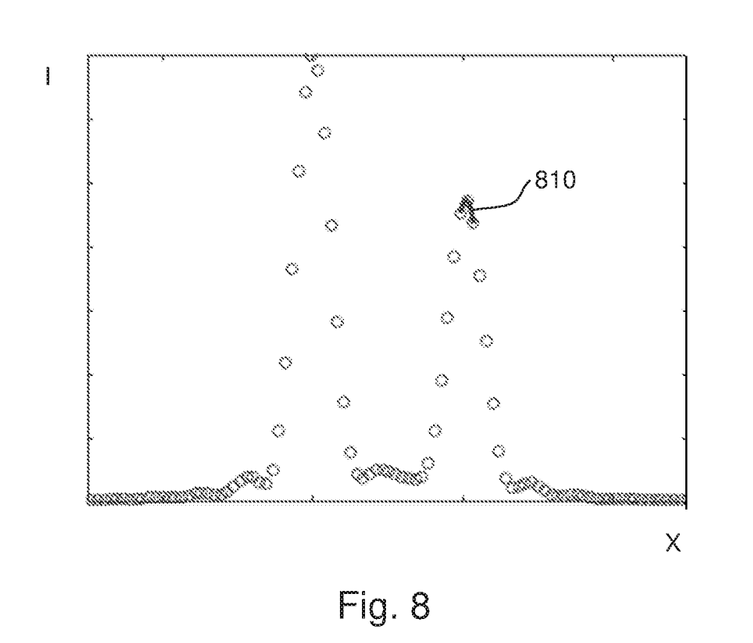
FIG. 8 is a plot of intensity cross-section along the X direction for a diffraction image of a large structure.

FIG. 8 illustrates the basic method. The figure shows a plot of intensity cross-section I against distance X in the X-direction for the two diffraction edges of a line structure. More specifically, the line may be a plot of the total intensity $I_{TOTAL}(x)$ along a segment of the structure, where:

$$I_{TOTAL}(x) = \int_{y_0}^{y_0+\Delta} I(x,y) dy.$$

and where $y_0$ is the starting position of a segment and $\Delta$ is the width of the segment.

A suitable fit (regression) is made to at least part of the peak being tracked, in this example a second order polynomial fit 810 is made to the intensity plot of the right edge. In an embodiment this fit may be made to only a few points around the peak, i.e., to the brightest pixels. In the specific example shown the fit 810 is to the three brightest pixels. However the fit may be to a greater number of pixels than three, or any other suitable fit which enables the central position of the edge to be found, e.g., a Gaussian fit. From the fit, the center position of the fit $x_c$ and the peak intensity of the fit $I_{peak}$ is determined. This is done for a number of positions (or segments) along the Y-axis, such that the variation in the peak position along the Y-axis is tracked, to obtain $x_c(y_0)$, $x_c(y_1)$, . . . , $x_c(y_n)$ and $I_{peak}(y_0)$, $I_{peak}(y_1)$ . . . $I_{peak}(y_n)$. It is then possible to directly determine the optically measured power spectra density (PSD) of LER, e.g., by Fourier transforming $x_c(y)$. The unit of PSD in this case is $nm^2/nm^{-1}$, and essentially describes the LER variance per spatial frequency. The magnitude of the LER can subsequently be determined from the baseline of the PSD; a larger baseline value indicating a greater LER magnitude.

Figure 9:
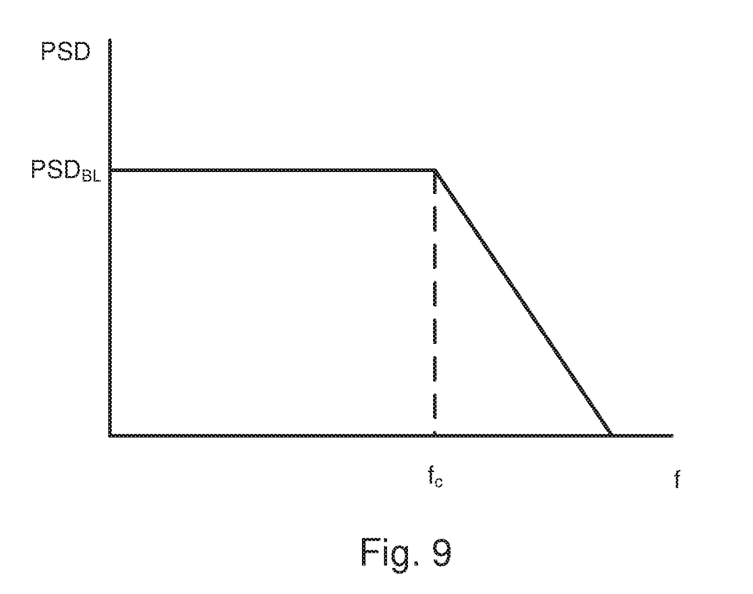
FIG. 9 is a plot of (e.g., LER) power spectral density (PSD) against spectral frequency, illustrating the concept of a baseline PSD usable as a metric for determining line edge roughness according to an embodiment of the invention.

FIG. 9 shows a typical plot of PSD against spatial frequency f. The PSD baseline value ($PSD_{BL}$) corresponds to the flat region of this plot before the cut-off frequency $f_c$. The integral of PSD is related to the variance of the edge position. As such, it can be appreciated that this approach provides the baseline (low frequency part) of the LER PSD, from which the LER can be inferred.

The second approach is based on the fact that there will be peak intensity variation in addition to peak position variation (e.g., the peak intensity ($I_{peak}(y)$) itself varies with LER such that, referring to the plot of FIG. 8, the peak will be seen to move up/down as well as left/right along the structure). A perfect line edge without LER will scatter/diffract light in a homogeneous way, such that there is no intensity variation along the line. When LER is induced, the surface is rough which induces a disturbance in the diffracted light which manifests itself as an intensity variation along the imaged diffraction edge.

This embodiment may use a similar calculation as that described in the first approach, i.e., using a Fourier Transform, but Fourier transforming $I_{peak}(y)$. The resulting PSD in this example will have a unit of $gl^2/nm^{-1}$ (where gl is the gray level on the camera), and therefore is not a standard LER PSD (i.e., PSD of LER). This intensity variation PSD describes the scattered light variation along the line edge at each spatial frequency, and is expected to be highly correlated with the LER PSD. The intensity variation PSD (e.g., its baseline value) can be correlated with LER in a calibration step, with the LER, for example, having been determined using the first approach described above, or from an SEM measurement.

It should be noted that in all the above examples, the intensity values (e.g., per pixel) may comprise an average (e.g., a mean) over a number of frames. Also for descriptive values of LER, standard deviations of edge position can be used. It should also be noted that the metrology may comprise measurement of structures formed in resist (after develop inspection ADI) or after etch (after etch inspection AEI).

Further embodiments are disclosed in the subsequent numbered clauses:

1. A method of measuring a parameter relating to a structure formed using a lithographic process, wherein said structure has a dimension which is sufficiently large to enable radiation diffracted by at least one edge of said structure to be optically resolved, the method comprising:
   obtaining an intensity metric from an image of the at least one edge; and
   determining a value for said parameter based on the intensity metric.

2. A method as defined in clause 1, wherein said structure has a dimension which is sufficiently large to enable radiation diffracted by at least two opposing edges of said structure to be individually optically resolved.

3. A method as defined in clause 1 or 2, wherein said dimension comprises a critical dimension greater than the optical resolution of a system used to perform the measurement of the structure, and preferably at least twice as large.

4. A method as defined in clause 1, 2 or 3, wherein said dimension comprises a critical dimension greater than 1 μm, and preferably greater than 2 μm.

5. A method as defined in any preceding clause, wherein said image of the at least one edge is formed substantially from higher diffraction order radiation scattered by said at least one edge.

6. A method as defined in any preceding clause, wherein said image of the at least one edge comprises an image of a plurality of edges, wherein each edge is individually resolved.

7. A method as defined in any preceding clause, wherein said parameter comprises dose.

8. A method as defined in any of clauses 1 to 6, wherein said parameter comprises focus.

9. A method as defined in clause 7 or 8, wherein the intensity metric comprises intensity of radiation diffracted by the at least one edge.

10. A method as defined in clause 9, wherein the intensity metric comprises a difference of a first intensity value describing the intensity of radiation diffracted by said at least one edge relating to illumination from a first direction and a second intensity value describing radiation diffracted by the same at least one edge relating to illumination from a second direction.

11. A method as defined in clause 7 or 8, wherein the structure comprises a periodic structure having a plurality of edges, and said intensity metric comprises determining a sum of first intensity values, each of first intensity values describing the intensity of radiation diffracted by one of said edges relating to illumination from a first direction and/or a sum of second intensity values, each of second intensity values describing the intensity of radiation diffracted by one of said edges relating to illumination from a second direction.

12. A method as defined in clause 11, wherein said periodic structure has a pitch greater than 2 μm.

13. A method as defined in clause 11 or 12, wherein the intensity metric comprises a difference of the sum of first intensity values and the sum of second intensity values, wherein the sum of first intensity values and the sum of second intensity values each relate to the same edges.

14. A method as defined in clause 10 or 13, wherein the intensity metric is normalized by the sum of the first intensity value(s) and/or the sum of the second intensity value(s).

15. A method as defined in any of clauses 10 to 14, wherein said illumination from a first direction relates to illumination via a first quadrant of an illumination pupil and said illumination from a second direction relates to illumination via a second quadrant of the illumination pupil.

16. A method as defined in any of clauses 8 to 15, comprising inferring a focus value from said intensity metric by referring to a focus calibration plot of intensity metric versus a known focus offset, said focus calibration plot having been determined from a calibration substrate exposed at a number of known focus offsets and subsequently measured to obtain corresponding intensity metric values.

17. A method as defined in any of clauses 1 to 6, wherein said parameter is line edge roughness.

18. A method as defined in clause 17, comprising determining:
a variation in a position of a peak in said intensity metric over a length of the edge, the variation in position being determined in a direction perpendicular to a length of the edge; and
determining said line edge roughness from the variation in position of the peak.

19. A method as defined in clause 18, wherein determining the line edge roughness comprises determining, at a number of different locations along the length of the edge, a suitable fit to at least a subset of intensity metric values, the subset comprising the peak intensity metric values.

20. A method as defined in clause 18 or 19 comprising determining a baseline value of a line edge roughness power spectral density from said variation in position, said baseline value being a value over a plurality of spatial frequencies for which the line edge roughness power spectral density is substantially constant; and determining the line edge roughness from said baseline value.

21. A method as defined in clause 17, comprising determining the line edge roughness from a variation in the peak value of the intensity metric over the length of the edge.

22. A method as defined in clause 21, comprising determining an intensity variation power spectral density from said variation in the peak value of the intensity metric; and determining the line edge roughness from said intensity variation power spectral density.

23. A method as defined in clause 21 or 22, comprising performing a calibration step to correlate this variation in the peak value with line edge roughness.

24. A computer program comprising program instructions operable to perform the method of any of clauses 1 to 23, when run on a suitable apparatus.

25. A non-transient computer program carrier comprising the computer program of clause 24.

26. A processing system comprising a processor and the computer program of clause 24.

27. A metrology system comprising:
a substrate holder for a substrate;
an illumination source for illuminating a structure on the substrate;
a sensor for sensing scattered illumination from the structure; and
the processing system of clause 26.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a lithographic process used to form a structure, wherein the structure comprises a dimension that enables a metrology system to optically resolve illumination diffracted by at least an edge of the structure, the method comprising:
illuminating the structure to generate scattered illumination from the structure;
directing first and second portions of the scattered illumination to a sensor for dark-field metrology using an optical system, wherein the first and second portions are associated with different non-zero diffraction orders arising from the edge;
receiving the scattered illumination at the sensor;
generating a detection signal based on the received scattered illumination using the sensor;
determining an intensity metric associated with the first and second portions based on an analysis of the detection signal using a processor; and
determining a value of the parameter based on the intensity metric using the processor.

2. The method of claim 1, wherein the dimension enables the metrology system to optically resolve the edge and another edge of the structure positioned adjacent to the edge.

3. The method of claim 1, wherein the dimension comprises a critical dimension greater than an optical resolution value of the metrology system.

4. The method of claim 3, wherein the critical dimension is at least twice as large as an optical resolution value of the metrology system.

5. The method of claim 1, wherein the dimension comprises a critical dimension greater than 1 µm.

6. The method of claim 1, wherein the detection signal comprises information of the edge and another edge of the structure and the dimension enables the metrology system to optically resolve the edge and the another edge.

7. The method of claim 1, wherein the parameter comprises focus and/or dose.

8. The method of claim 7, wherein:
the first and second portions are further associated with first and second illumination directions, respectively;
the first illumination direction is different from the second illumination direction;
the intensity metric comprises a difference of a first intensity value associated with the first illumination direction and a second intensity value associated with the second direction; and
the determining the value of the parameter is based on the difference.

9. The method of claim 7, wherein:
the structure comprises a periodic structure having a plurality of edges and a pitch greater than 2 µm;
the first and second portions are further associated with first and second illumination directions, respectively;
the first illumination direction is different from the second illumination direction;
the intensity metric comprises a sum of first intensity values associated with the plurality of edges and the first direction and/or a sum of second intensity values associated with the plurality of edges and the second direction; and
the determining the value of the parameter is based on the sum of the first and/or second intensity values.

10. The method of claim 1, further comprising determining a line edge roughness of the edge based on the intensity metric using the processor.

11. The method of claim 10, wherein:
the intensity metric comprises a variation of a position of an intensity peak over a length of the edge based on a plurality of regression fits of intensity values derived from the detection signal by the processor;
the variation of the position is defined along a direction perpendicular to the length of the edge; and
the determining the line edge roughness is based on the variation.

12. The method of claim 11, wherein:
the intensity metric further comprises a baseline value of a power spectral density of the line edge roughness based on the variation;
the baseline value is associated with a plurality of spatial frequencies for which the power spectral density is substantially constant; and
the determining the line edge roughness is further based on the baseline value.

13. The method of claim 10, wherein:
the intensity metric comprises an intensity variation power spectral density based on a variation of an intensity peak value over a length of the edge; and
the determining the line edge roughness is based on the intensity variation power spectral density.

14. The method of claim 1, wherein the dimension comprises a critical dimension greater than 2 µm.

15. A non-transitory computer-readable medium having instructions stored thereon, that, when executed on a processor configured to receive a dark-field detection signal from a sensor of a metrology system, cause the processor to perform operations comprising:
determining an intensity metric associated with first and second different non-zero diffraction orders of scattered illumination from an edge of a structure based on an analysis of the dark-field detection signal; and
determining, based on the intensity metric, a value of a parameter of a lithographic process used to form the structure.

16. The non-transitory computer-readable medium of claim 15, wherein the parameter comprises dose and/or focus.

17. The non-transitory computer-readable medium of claim 15, wherein:
the intensity metric comprises a variation of a position of an intensity peak over a length of the edge based on a plurality of regression fits of intensity values;
the variation of the position is defined along a direction perpendicular to the length of the edge; and
the operations further comprise:
deriving the intensity values from the dark-field detection signal; and
determining a line edge roughness of the edge based on the variation.

18. A metrology system comprising:
an illumination source configured to illuminate a structure to generate scattered illumination from the structure;
a sensor configured to receive the scattered illumination and to generate a detection signal based on the received scattered illumination; and
an optical system configured to direct first and second portions of the scattered illumination to the sensor for dark-field metrology, wherein the first and second portions are associated with different non-zero diffraction orders from an edge of the structure;
a non-transitory computer-readable medium having instructions stored thereon, that, when executed on a processor configured to receive the detection signal, cause the processor to perform operations comprising:
determining an intensity metric associated with the first and/or second portions based on an analysis of the detection signal; and
determining, based on the intensity metric, a value of a parameter of a lithographic process used to form the structure.

19. The metrology system of claim 18, wherein the parameter comprises dose and/or focus.

20. The metrology system of claim 18, wherein:
the determining the value of the parameter is further based on a frequency domain transform of intensity values derived from the detection signal; and
the operations further comprise:
performing the frequency-domain transform; and
determining a line edge roughness of the edge based on the frequency domain transform.

* * * * *